United States Patent
Aika et al.

(10) Patent No.: US 9,558,989 B2
(45) Date of Patent: Jan. 31, 2017

(54) METHOD FOR MANUFACTURING SEMICONDUCTOR DEVICE

(71) Applicant: Renesas Electronics Corporation, Kawasaki-shi, Kanagawa (JP)

(72) Inventors: Tomohiko Aika, Ibaraki (JP); Hajime Suzuki, Kanagawa (JP); Naoki Fujita, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/796,984

(22) Filed: Jul. 10, 2015

(65) Prior Publication Data

US 2016/0013092 A1   Jan. 14, 2016

(30) Foreign Application Priority Data

Jul. 10, 2014   (JP) .................................. 2014-141877

(51) Int. Cl.
  *H01L 21/76*    (2006.01)
  *H01L 21/762*   (2006.01)
  *H01L 27/12*    (2006.01)
  *H01L 21/8234*  (2006.01)

(52) U.S. Cl.
  CPC .  *H01L 21/76224* (2013.01); *H01L 21/823481* (2013.01); *H01L 27/1203* (2013.01)

(58) Field of Classification Search
  CPC ................... H01L 21/76224; H01L 21/823481; H01L 27/1203
  See application file for complete search history.

(56) References Cited

U.S. PATENT DOCUMENTS

| 5,763,932 | A  | * | 6/1998 | Pan ................... | H01L 21/76224 257/510 |
| 5,895,254 | A  | * | 4/1999 | Huang .............. | H01L 21/76224 148/DIG. 50 |
| 6,197,659 | B1 | * | 3/2001 | Liu ................... | H01L 21/76224 257/E21.546 |
| 6,248,645 | B1 | * | 6/2001 | Matsuoka ......... | H01L 21/76237 257/E21.551 |
| 6,403,492 | B1 | * | 6/2002 | Buynoski .......... | H01L 21/76224 257/E21.244 |
| 6,544,839 | B1 |   | 4/2003 | Kanamitsu | |
| 6,884,725 | B2 | * | 4/2005 | Moore .............. | H01L 21/76235 257/E21.244 |

FOREIGN PATENT DOCUMENTS

JP      2000-200878 A     7/2000

* cited by examiner

*Primary Examiner* — Zandra Smith
*Assistant Examiner* — John M Parker
(74) *Attorney, Agent, or Firm* — Shapiro, Gabor and Rosenberger, PLLC

(57) ABSTRACT

After embedding a silicon oxide film within a second trench that opens in a semiconductor substrate using a silicon nitride film as a hard mask, the silicon oxide film over the silicon nitride film is polished, and then, wet etching is performed before a step for removing the silicon nitride film, and thereby the upper surface of the silicon oxide film within a first trench opened in the silicon nitride film is retreated.

9 Claims, 13 Drawing Sheets

US 9,558,989 B2

METHOD FOR MANUFACTURING SEMICONDUCTOR DEVICE

CROSS-REFERENCE TO RELATED APPLICATIONS

The disclosure of Japanese Patent Application No. 2014-141877 filed on Jul. 10, 2014 including the specification, drawings and abstract is incorporated herein by reference in its entirety.

BACKGROUND

The present invention relates to a method for manufacturing a semiconductor device, and relates more specifically to a technology effective in being applied to a method for manufacturing a semiconductor device including an element isolation region.

As the structure of the element isolation region arranged in the main surface of a semiconductor substrate in order to electrically isolate plural regions (active regions) that respectively form the semiconductor element from each other in the main surface of the semiconductor substrate, STI (Shallow Trench Isolation), LOCOS (Local Oxidization of Silicon), and the like are known.

In Japanese Unexamined Patent Application Publication No. 2000-200878, a method for forming the element isolation region of the STI structure is described.

SUMMARY

As the method for forming the element isolation region of the STI structure, a method is known in which an insulation film is embedded in a trench opened in the upper surface of a semiconductor substrate, and excess insulation film over the semiconductor substrate is thereafter polished and removed. At this time, it is probable that, due to the dispersion of the polishing amount, the insulation film covering the main surface of the semiconductor substrate cannot be removed and remains. In this case, such problems may occur thereafter that the contact plugs formed for coupling with the substrate do not conduct. Also, there is a risk that withstand voltage failure between the elements may occur due to the dispersion of the polishing amount.

Further, when a level difference is generated in the upper surface of the element isolation region formed, there are risks of occurrence of short-circuit in the semiconductor device, formation failure in forming the film, and so on because a conductive film and the like are embedded and remain in the recessed portion of the level difference.

Other problems and new features will be clarified from the description of the present specification and the attached drawings.

Out of the embodiments disclosed in the present application, the summary of a representative one will be described briefly as follows.

A method for manufacturing a semiconductor device which is an embodiment includes embedding a silicon oxide film in a trench that opens in a semiconductor substrate using a silicon nitride film as a hard mask, thereafter polishing the silicon oxide film over the silicon nitride film, then performing etching before the silicon nitride film removing step, and thereby retreating the upper surface of the silicon oxide film in the trench opened in the silicon nitride film.

According to an embodiment disclosed in the present application, the yield in the manufacturing step of the semiconductor device can be improved.

DETAILED DESCRIPTION

Below, embodiments will be explained in detail based on the drawings. Also, in all drawings for explaining the embodiments, a same reference sign will be given to a member having a same function, and repeated explanation thereon will be omitted. Further, in the embodiments below, explanation on a same or similar portions will not be repeated in principle except when it is particularly required.

In the method for manufacturing a semiconductor device of the present embodiment, an insulation film for forming an element isolation region is embedded in a trench of the upper surface of a semiconductor substrate, a part of the insulation film over the semiconductor substrate is polished, then, a wet etching step is performed, and thereby the yield in the element isolation region forming step is improved.

Below, the method for manufacturing a semiconductor device of the present embodiment will be explained using FIG. 1 to FIG. 15. FIG. 1 to FIG. 15 are cross-sectional views shown for explaining the method for manufacturing a semiconductor device of the present embodiment.

Figure 1:
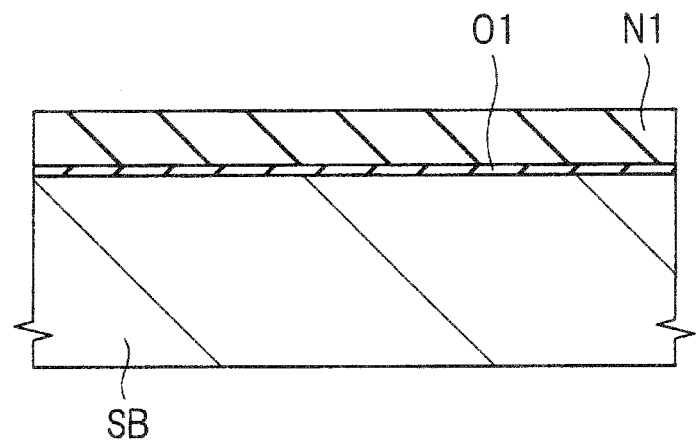
FIG. 1 is a cross-sectional view showing a method for manufacturing a semiconductor device which is an embodiment of the present invention.

First, as shown in FIG. 1, a semiconductor substrate SB comprised of mono-crystal silicon for example is provided. Next, after forming a silicon oxide film O1 that is an insulation film over the main surface of the semiconductor substrate SB using a thermal oxidation method and the like for example, a silicon nitride film N1 that is an insulation film is formed over the silicon oxide film O1 using a CVD (Chemical Vapor Deposition) method for example. The film thickness of the silicon oxide film O1 is 10 nm for example, and the film thickness of the silicon nitride film N1 is 170 nm for example. Here, the film thickness of the silicon nitride film N1 may be 200 nm or more. Also, the film thickness referred to in the present application means the length (thickness) of the film in the direction perpendicular to a plane of a substrate of a specific film.

Here, although the silicon oxide film O1 is formed beneath the silicon nitride film N1, it is also possible not to form the silicon oxide film O1.

Figure 2:
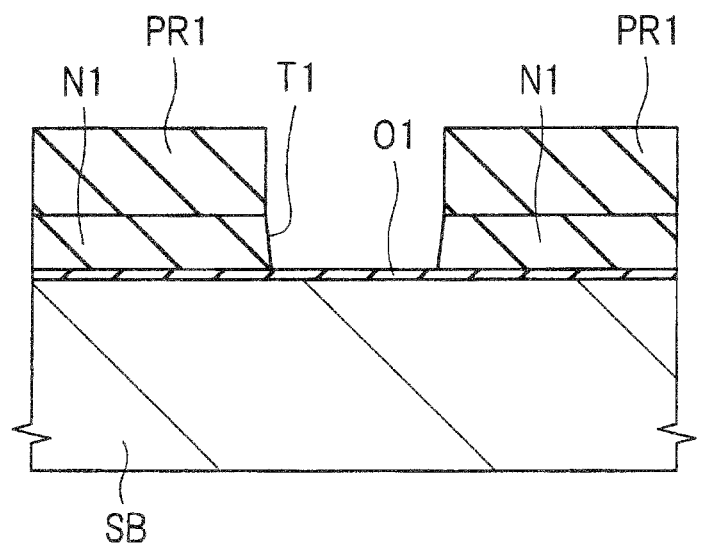
FIG. 2 is a cross-sectional view showing the method for manufacturing a semiconductor device subsequent to FIG. 1.

Next, as shown in FIG. 2, a pattern of a photoresist film PR1 is formed over the silicon nitride film N1 using a photolithography technology. Here, the region that becomes an active region in a subsequent step is covered by the photoresist film PR1, and an inactive region that forms an element isolation region in a later step is exposed from the photoresist film PR1.

Then, the silicon nitride film N1 is opened by performing dry etching using the photoresist film PR1 as a mask. Thereby, a trench T1 is opened in the silicon nitride film N1 in the inactive region. The trench (opening) T1 penetrates the silicon nitride film N1, and the silicon oxide film O1 is exposed in the bottom surface of the trench T1. At this time, the side wall of the silicon nitride film N1 which is the side wall of the trench T1 is tapered. In other words, the trench T1 has such shape that the opening width increases from the bottom thereof toward the top.

Figure 3:
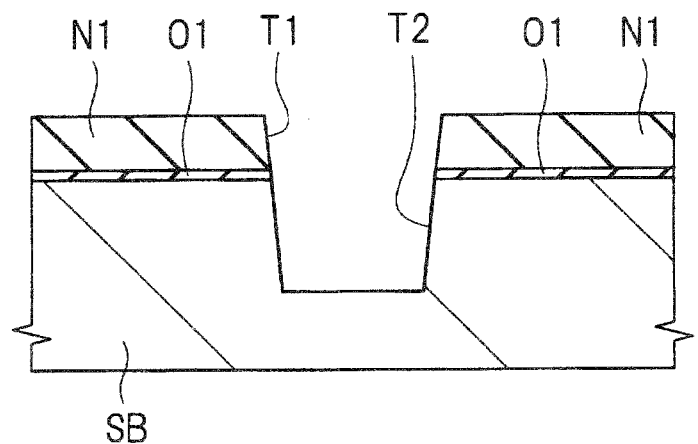
FIG. 3 is a cross-sectional view showing the method for manufacturing a semiconductor device subsequent to FIG. 2.

Next, as shown in FIG. 3, after the photoresist film PR1 has been removed, dry etching is performed using the silicon nitride film N1 as the hard mask, and thereby a part of the silicon oxide film O1 and a part of the upper surface of the semiconductor substrate SB below the trench T1 are removed. Thus, a trench T2 is formed in the upper surface of the semiconductor substrate SB. The trench T2 is opened below the trench T1, and reaches a middle depth of the semiconductor substrate SB.

The depth of the trench T2 which is the distance from the uppermost surface of the semiconductor substrate SB to the bottom surface of the trench T2 in the direction perpendicular to the uppermost surface is 350 nm for example. At this time, the opening width of the trench T2 reduces as it approaches the bottom surface from the upper part (opening). In other words, the side wall of the trench T2 has a shape tapered similarly to the side wall of the trench T1. More specifically, the side wall of the trench T2 is formed obliquely with respect to the main surface of the semiconductor substrate SB, the upper surface of the active region and the bottom surface of the trench T2 do not overlap with each other in plan view, and the side wall does not overlap with the upper surface of the active region in plan view.

Figure 4:
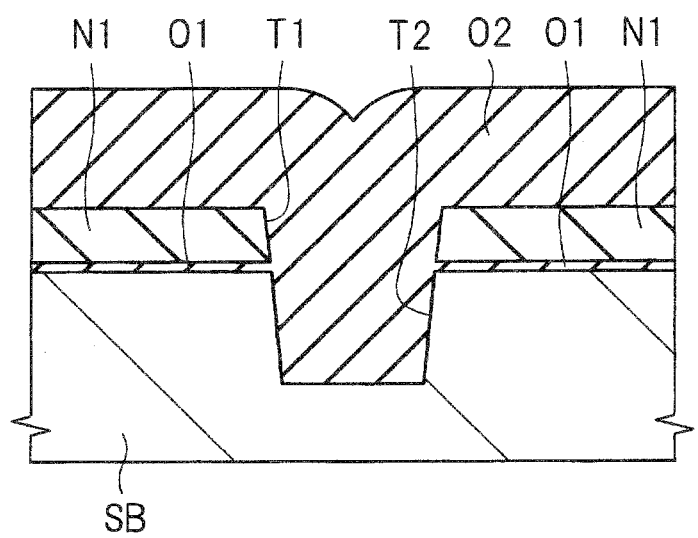
FIG. 4 is a cross-sectional view showing the method for manufacturing a semiconductor device subsequent to FIG. 3.

Next, as shown in FIG. 4, a silicon oxide film O2 with the film thickness of 600 nm is formed (stacked) over the entire surface of the upper surface of the semiconductor substrate SB by the CVD method for example. Thereby, the inside of the trench T2 whose depth is 350 nm is entirely buried by the silicon oxide film O2. Because the upper surface of the semiconductor substrate SB is recessed in the forming area of the trench T2, a recess is formed in the upper surface of the silicon oxide film O2 formed right above the center part of the trench T2. Therefore, the height of the upper surface of the silicon oxide film O2 right above the trench T2 is lower than the height of the upper surface of the region beside the trench T2 in the direction along the upper surface of the semiconductor substrate SB, that is, the silicon oxide film O2 right above the semiconductor substrate SB of the active region. With respect to the material of the silicon oxide film O2, a TEOS (Tetra Ethyl Ortho Silicate) film can be used for example.

Particularly, in a region where the width of the trench T2 is larger than twice the film thickness of the silicon oxide film O2, that is the region where the width of the inactive region is wide, there is a big height difference between the height of the upper surface that is lowest in the upper surface of the silicon oxide film O2 and the height of the upper surface of the silicon oxide film O2 of the active region. The height difference has a magnitude generally same to the depth of the trench T2. However, because the film thickness of the silicon oxide film O2 is larger than the depth of the trench T2, even in the region where the width of the inactive region is wide, the height of the upper surface of the silicon oxide film O2 within the trench T2 is positioned higher than the upper surface of the semiconductor substrate SB of the active region. Also, in the drawing, a structure is shown in which each of the silicon oxide films O1, O2 does not show a boundary at which they contact each other and is shown in which the silicon oxide films O1 and O2 are integrated to each other at the boundary of the inactive region and the active region.

Figure 5:
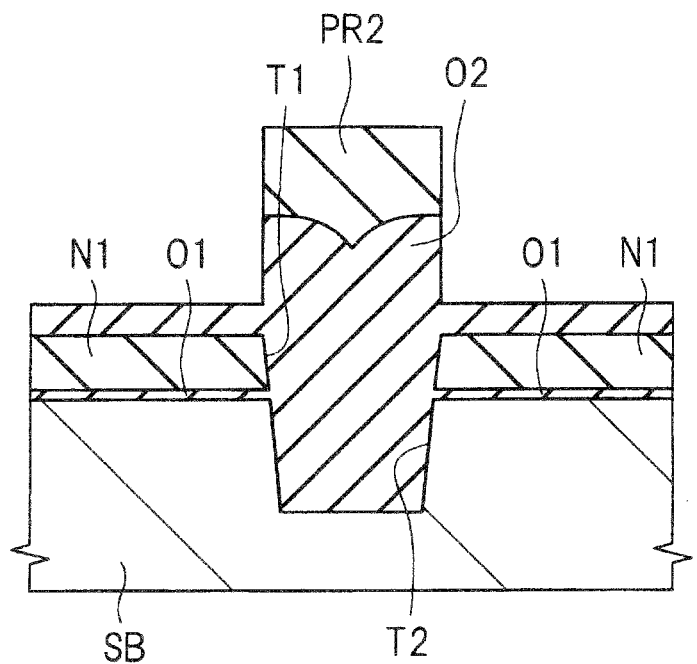
FIG. 5 is a cross-sectional view showing the method for manufacturing a semiconductor device subsequent to FIG. 4.

Next, as shown in FIG. 5, the upper surface of the silicon oxide film O2 right above the trench T2 is covered by the photoresist film PR2. The photoresist film PR2 is a pattern that covers the inactive region of the semiconductor substrate SB and exposes the active region of the semiconductor substrate SB.

Then, by performing dry etching using the photoresist film PR2 as the mask, the upper surface of the silicon oxide film O2 of the active region is retreated. Here, the upper surface of the silicon nitride film N1 of the active region is not exposed, and the silicon oxide film O2 is made to remain over the silicon nitride film N1. The reason the upper surface of the silicon oxide film O2 of the active region is retreated and the upper surface of the silicon oxide film O2 right above the trench T2 is not retreated thus is to prevent the height of the upper surface of the silicon oxide film O2 within the trench T2 with a wide width as described above from becoming excessively low by the polishing step described below (refer to FIG. 7 or FIG. 8).

Figure 6:
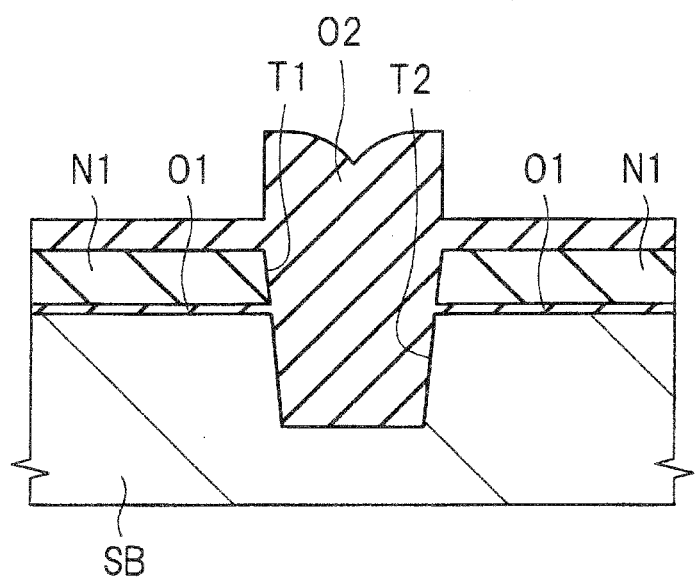
FIG. 6 is a cross-sectional view showing the method for manufacturing a semiconductor device subsequent to FIG. 5.

Next, as shown in FIG. 6, the photoresist film PR2 is removed. The upper surface of the silicon oxide film O2 at the end of the inactive region is positioned higher than the upper surface of the silicon oxide film O2 of the active region.

Figure 7:
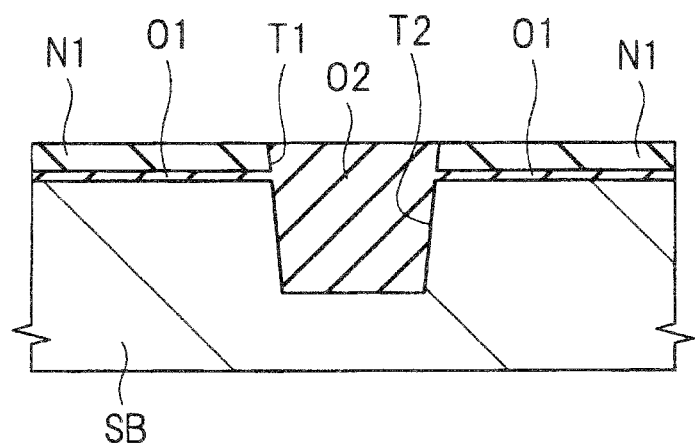
FIG. 7 is a cross-sectional view showing the method for manufacturing a semiconductor device subsequent to FIG. 6.

Next, as shown in FIG. 7, by polishing the silicon oxide film O2 and the silicon nitride film N1 using a CMP (Chemical Mechanical Polishing) method for example, respective upper surfaces of the silicon oxide film O2 and the silicon nitride film N1 are flattened. Also, at this time, because the silicon nitride film N1 is not removed entirely, the silicon oxide film O1 is not exposed. In other words, polishing is stopped at a region higher than the bottom surface of the silicon nitride film N1.

Although it is ideal to stop the polishing performed here in the middle of the film thickness of the silicon nitride film N1 as shown in FIG. 7, there are various patterns of the active region or inactive region on the semiconductor substrate SB, and difference is generated in the polishing amount according to the location of the main surface of the semiconductor substrate SB because of the coarseness of these patterns. Therefore, as shown below, dispersion is generated in the polishing amount by the polishing step.

Figure 8:
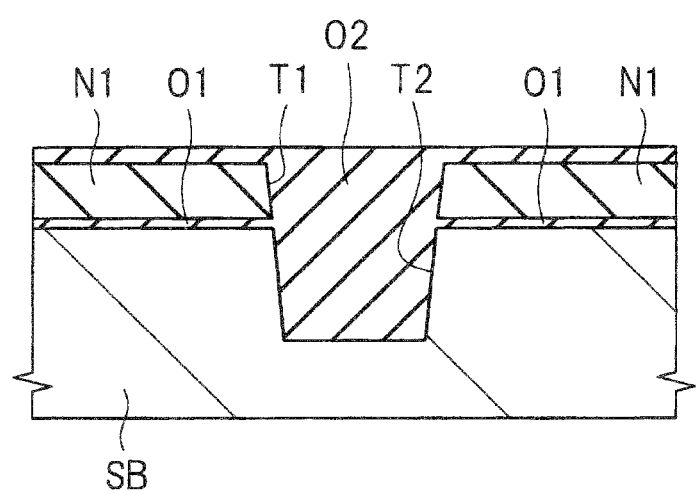
FIG. 8 is a cross-sectional view showing the method for manufacturing a semiconductor device subsequent to FIG. 6.

More specifically, when the polishing amount is comparatively small as shown in FIG. 8, it is possible that the silicon oxide film O2 over the silicon nitride film N1 remains. In other words, as shown in FIG. 7, the silicon nitride film N1 is not polished, and the silicon oxide film O2 over the upper surface of the silicon nitride film N1 is not removed entirely also. Therefore, in the active region as shown in FIG. 8, the upper surface and the side wall of the silicon nitride film N1 remain in a covered state by the silicon oxide film O2.

According to the present embodiment, in both of the case a part of the silicon nitride film N1 is polished as shown in FIG. 7 or the case the silicon oxide film O2 remains over the silicon nitride film N1 as shown in FIG. 8 by the polishing step, the element isolation region can be formed into a desired shape by a same number of steps. Below, a step following the step explained using FIG. 7 will be explained using FIG. 9, and a step following the step explained using FIG. 8 will be explained using FIG. 10. Both of the steps explained using each of FIG. 9 and FIG. 10 are wet etching steps for removing a part of the silicon oxide film O2, and the difference of these steps is only in the etching condition such as the time for etching.

Figure 9:
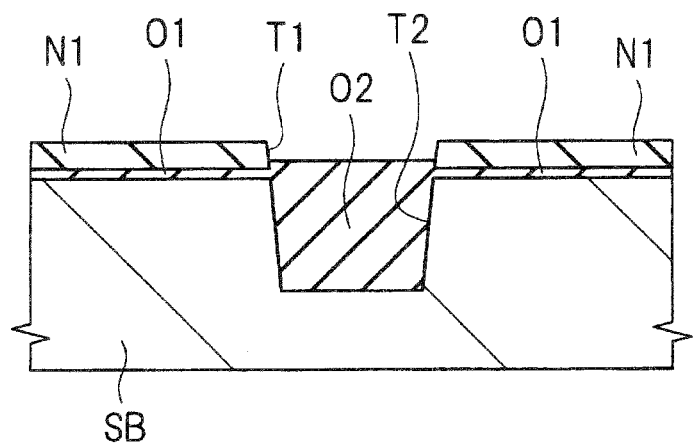
FIG. 9 is a cross-sectional view showing the method for manufacturing a semiconductor device subsequent to FIG. 7.

When the structure explained using FIG. 7 has been obtained, by performing wet etching next using hydrofluoric acid (HF) as shown in FIG. 9, a part of the silicon oxide film O2 exposed within the trench T1 is selectively removed. In other words, the silicon nitride film N1 is not removed. More specifically, here, wet etching having a higher selection ratio for the silicon oxide film O2 relative to the silicon nitride film N1 is performed.

Thus, by retreating the upper surface of the silicon oxide film O2 within the trench T1, the side wall of the silicon nitride film N1 which is the side wall of the trench T1 having been covered by the silicon oxide film O2 is exposed. Here, by adjusting the etching time, the etching amount is controlled so that the height of the upper surface of the silicon oxide film O2 does not become lower than the height of the lower surface of the silicon nitride film N1. In other words, a part of the silicon oxide film O2 higher than the lower surface of the silicon nitride film N1 is removed, and the silicon oxide film O2 lower than the lower surface of the silicon nitride film N1 is not removed. For example, the upper surface of the silicon oxide film O2 is retreated to a position higher than the bottom surface of the silicon nitride film N1 by 3 nm.

Figure 10:
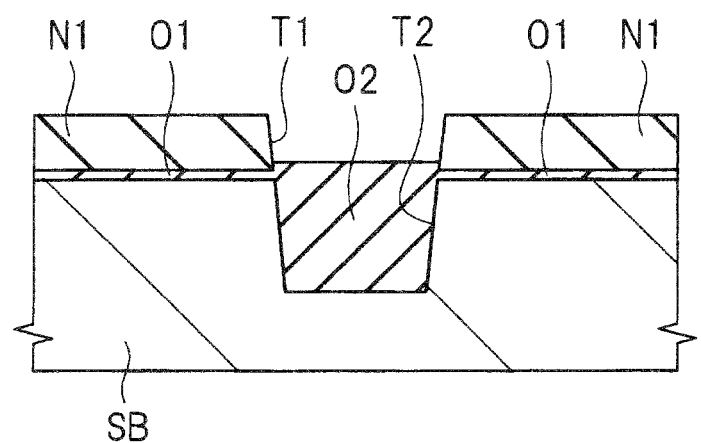
FIG. 10 is a cross-sectional view showing the method for manufacturing a semiconductor device subsequent to FIG. 8.

Also, when the structure explained using FIG. 8 has been obtained, by performing wet etching next using hydrofluoric acid (HF) as shown in FIG. 10, the silicon oxide film O2 over the silicon nitride film N1 and a part of the silicon oxide film O2 within the trench T1 are selectively removed. In other words, the silicon nitride film N1 is not removed. More specifically, here, wet etching having a higher selection ratio for the silicon oxide film O2 relative to the silicon nitride film N1 is performed.

Thus, the upper surface of the silicon nitride film N1 is exposed. Also, by retreating the upper surface of the silicon oxide film O2 within the trench T1 by this etching step, the side wall of the silicon nitride film N1 which is the side wall of the trench T1 having been covered by the silicon oxide film O2 is exposed. Here, similarly to the configuration explained using FIG. 9, the etching amount is controlled so that the height of the upper surface of the silicon oxide film O2 does not become lower than the height of the lower surface of the silicon nitride film N1. For example, the upper surface of the silicon oxide film O2 is retreated to a position higher than the bottom surface of the silicon nitride film N1 by 3 nm.

The difference of the structures shown in each of FIG. 9 and FIG. 9 is only the difference of the film thickness of the silicon nitride film N1. In the structure shown in FIG. 9, the film thickness of the silicon nitride film N1 becomes thin because the upper part of the silicon nitride film N1 is polished in the polishing step explained using FIG. 7. According to the wet etching performed in the step explained using FIG. 9 or FIG. 10, the upper surface of the silicon oxide film O2 can be retreated precisely to a desired height. The reason is that the time for wet etching required for retreating the upper surface of the silicon oxide film O2 to a desired height can be adjusted by inspecting the film thickness of the silicon oxide film O2 having remained in the polishing step explained using FIG. 7 or FIG. 8.

Figure 11:
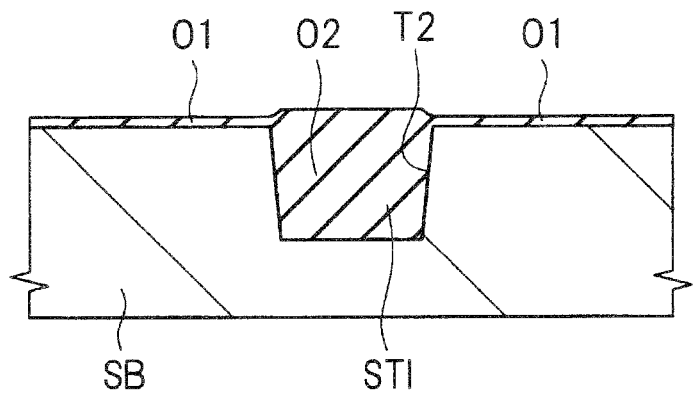
FIG. 11 is a cross-sectional view showing the method for manufacturing a semiconductor device subsequent to FIG. 9 or FIG. 10.

Next, after having obtained the structure shown in FIG. 9 or FIG. 10, the silicon nitride film N1 is removed by wet etching using a hot phosphoric acid solution for example as shown in FIG. 11. More specifically, here, wet etching having a higher selection ratio for the silicon nitride film N1 relative to the silicon oxide films O1, O2 is performed. Thus, the upper surface of the silicon oxide film O1 in the active region is exposed. Also, when the silicon oxide film O1 has not been formed, the upper surface of the semiconductor substrate SB in the active region is exposed by the step described above.

In this step, because the upper surface of the silicon oxide film O1 within the trench T1 (refer to FIG. 9 or FIG. 10) is slightly removed, the height difference between the height of the upper surface of the silicon oxide film O2 right above the trench T2 which is the inactive region and the height of the upper surface of the silicon oxide film O1 in the active region becomes less than 3 nm. In other words, in the boundary of the silicon oxide film O1 and the silicon oxide film O2, the unevenness of the upper surface of these insulation films is almost eliminated.

However, the upper surface of the silicon oxide film O2 in the inactive region is positioned higher than the upper surface of the silicon oxide film O1 in the active region. Even when the silicon oxide film O1 has not been formed, the upper surface of the silicon oxide film O2 in the inactive region is positioned in a region higher than the upper surface of the semiconductor substrate SB. By the step described above, an element isolation region STI comprised of the silicon oxide film O2 embedded in the trench T2 is formed.

Figure 12:
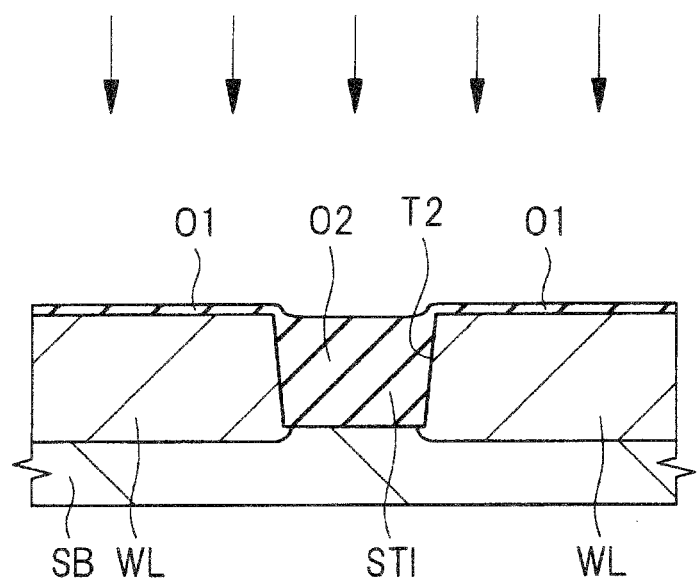
FIG. 12 is a cross-sectional view showing the method for manufacturing a semiconductor device subsequent to FIG. 11.

Next, as shown in FIG. 12, impurities are implanted to the upper surface of the semiconductor substrate SB of the active region using an ion-implantation method and the like. Here, by implanting impurities of P-type (for example B (boron)) for example, P-wells WL are formed in the upper surface of the semiconductor substrate SB. The P-wells WL are formed to a depth deeper than the element isolation region STI within the semiconductor substrate SB. Also, here, in order to work a silicon oxide film (not illustrated) and the like formed over the semiconductor substrate SB, dry etching or wet etching may be performed.

By performing these ion implantation step or etching step and so on, the upper surface of the element isolation region STI is partly removed and retreats as shown in FIG. 12. In other words, by performing the ion-implantation step or the etching step, the surface of the element isolation region STI is wet-etched. Also, when a photoresist film is used in performing these ion implantation step or etching step, in a step of removing the photoresist film also, the upper surface of the element isolation region STI is subjected to wet etching, and therefore the upper surface of the element isolation region STI retreats. Further, when the semiconductor substrate SB is washed after performing the etching step and the like also, the upper surface of the element isolation region STI is subjected to wet etching, and therefore the upper surface of the element isolation region STI retreats.

Thus, the upper surface of the silicon oxide film O2 retreats. Here, the height of the upper surface of the silicon oxide film O2 is lower than the height of the upper surface of the semiconductor substrate SB with the exception of the vicinity of the side wall of the trench T2. Further, here, although the silicon oxide film O1 may be removed and the upper surface of the semiconductor substrate SB may be exposed, in the drawing, a configuration of a case the silicon oxide film O1 remains is shown.

When the center part of the upper surface of the element isolation region STI is a first region and the end embracing the center part of the upper surface of the element isolation region STI is a second region, it is possible that the upper surface of the element isolation region STI of the second region is higher than that of the first region. However, to the contrary, it is also possible that the upper surface of the element isolation region STI of the first region is higher than that of the second region.

More specifically, in the upper surface of the element isolation region STI, the first region and the second region which are arrayed side by side along the upper surface exist, and the second region is positioned closer to the side wall of the trench T2 than the first region. In the present embodiment, when the height of the upper surface of the element isolation region STI of the first region is higher than that of the second region, the difference between the height of the upper surface of the element isolation region STI in the first region and the height of the upper surface of the element isolation region STI in the second region is 5 nm or less.

Figure 13:
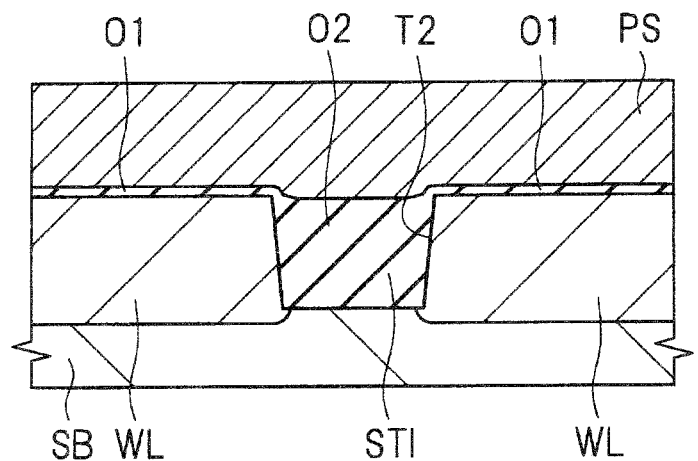
FIG. 13 is a cross-sectional view showing the method for manufacturing a semiconductor device subsequent to FIG. 12.

Next, as shown in FIG. 13, a poly-silicon film PS is formed over the element isolation region STI and over the semiconductor substrate SB using the CVD method for example. The poly-silicon film is formed so as to cover the upper surfaces of each of the element isolation region STI and the semiconductor substrate SB.

Figure 14:
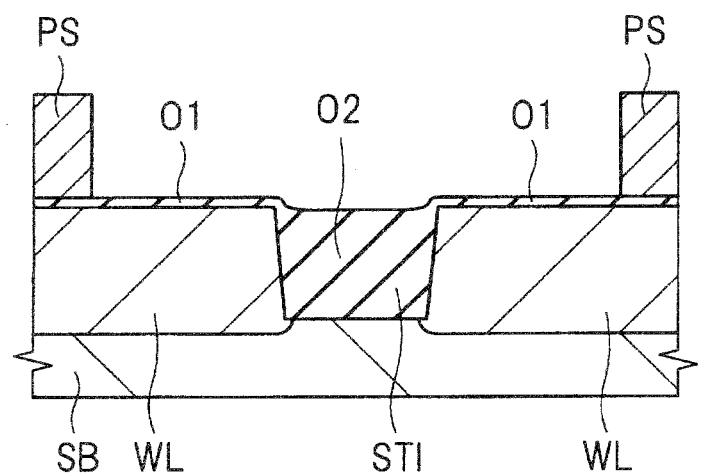
FIG. 14 is a cross-sectional view showing the method for manufacturing a semiconductor device subsequent to FIG. 13.

Next, as shown in FIG. 14, the poly-silicon film PS is worked using the photolithography technology and the dry etching method. Thus, the upper surface of the element isolation region STI and a part of the upper surface of the semiconductor substrate SB are exposed from the poly-silicon film PS. The poly-silicon film PS having been subjected to patterning forms a gate electrode of a MOSFET (Metal Oxide Semiconductor Field Effect Transistor). Further, the poly-silicon film PS may be used also as the electrode of a capacitative element and the like.

Figure 15:
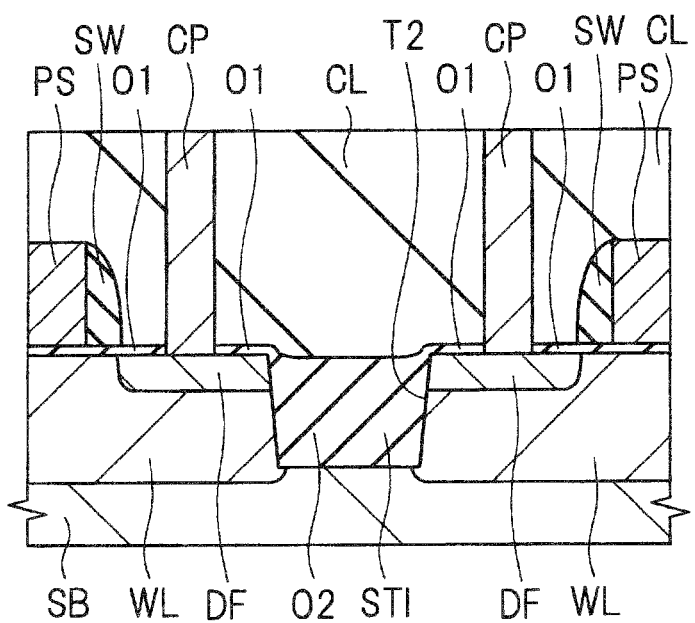
FIG. 15 is a cross-sectional view showing the method for manufacturing a semiconductor device subsequent to FIG. 14.

Next, as shown in FIG. 15, a side wall SW comprised of an insulation film covering the side wall of the poly-silicon film PS is formed in a self-aligning manner. Thereafter, by introducing impurities (for example P (phosphor) or As (arsenic)) of N-type of high concentration to the element isolation region STI, the poly-silicon film PS, and the upper surface of the semiconductor substrate SB exposed from the side wall SW by the ion-implantation method and the like, a diffusion layer DF is formed in the upper surface of the semiconductor substrate SB beside the poly-silicon film PS. The diffusion layer DF is a semiconductor region that configures a source/drain region of the MOSFET for example. Thereafter, silicide layers (not illustrated) are formed in each of the upper surface of the diffusion layer DF and the upper surface of the poly-silicon film PS. Thus, the MOSFET that is a semiconductor element is formed.

Then, an interlayer insulation film CL is formed over the semiconductor substrate SB using the CVD method and the like so as to cover the upper surfaces of the poly-silicon film PS, the element isolation region STI and the semiconductor substrate SB. The interlayer insulation film CL is comprised of a silicon oxide film for example. Thereafter, contact holes that penetrate the interlayer insulation film CL and the silicon oxide film O1 are formed, and then, contact plugs that bury the contact holes are formed. The contact plugs are mainly comprised of W (tungsten) for example, and are electrically coupled with the diffusion layer DF in the upper surface of the semiconductor substrate SB through a silicide layer (not illustrated). Thereafter, a wiring layer is formed over the interlayer insulation film CL, and then, the semiconductor substrate SB is segmented by dicing, whereby plural semiconductor chips are thereby obtained.

Thus, the semiconductor device of the present embodiment including the element isolation region STI is completed.

Figure 20:
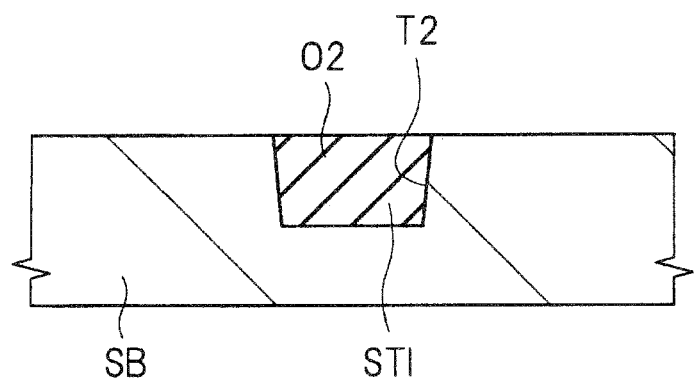
FIG. 20 is a cross-sectional view showing a method for manufacturing a semiconductor device which is a comparative example.
Figure 21:
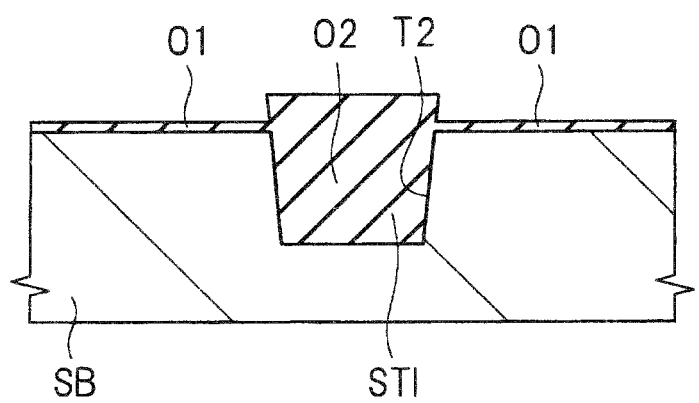
FIG. 21 is a cross-sectional view showing a method for manufacturing a semiconductor device which is a comparative example.

Below, the effect of the method for manufacturing a semiconductor device of the present embodiment will be explained using comparative examples shown in FIG. 20 and FIG. 21. FIG. 20 and FIG. 21 are cross-sectional views showing methods for manufacturing a semiconductor device which are comparative examples. Here, first, second and third comparative examples will be explained. The manufacturing step of any of the first-third comparative examples is different from the manufacturing step of the semiconductor device of the present embodiment in terms that the wet etching step explained using FIG. 9 or FIG. 10 is not performed. In other words, after the polishing step explained using FIG. 7 or FIG. 8, the step for removing the silicon nitride film N1 explained using FIG. 11 is performed consecutively.

In the manufacturing step of a semiconductor device of the first comparative example, the steps explained using FIG. 1 to FIG. 6 are performed first, and then, the polishing step explained using FIG. 8 is performed.

In a case the polishing amount is less and the silicon nitride film N1 is covered by the silicon oxide film O2 as shown in FIG. 8, when a step for removing the silicon nitride film N1 (refer to FIG. 11) is going to be performed consecutively, the silicon nitride film N1 cannot be removed. More specifically, because the silicon nitride film N1 is covered by the silicon oxide film O2, even when chemicals are used for removing the silicon nitride film N1 by the wet etching method, the silicon nitride film N1 is not exposed to the chemicals.

Therefore, as explained using FIG. 8, when the polishing amount in the polishing step is insufficient, the silicon nitride film N1 cannot be removed. In this case, as described below, even when the contact plugs (refer to FIG. 15) are formed with an aim of electrically coupling with the semiconductor substrate SB, the contact plugs do not penetrate the silicon nitride film, and the continuity failure occurs between the contact plugs and the semiconductor substrate SB. Also, such problem occurs that the semiconductor element cannot be formed over the semiconductor substrate SB.

Therefore, the semiconductor substrate that is a semiconductor wafer in which the silicon nitride film N1 has not been removed and has remained is abandoned, or the manufacturing step of the semiconductor device described above is performed to the end, plural semiconductor chips are formed, and then, the semiconductor chips including the region where the silicon nitride film N1 has remained as describe above are abandoned. In these cases, there is a problem that the yield in the manufacturing step of the semiconductor device drops and the manufacturing cost of the semiconductor device increases.

In order to avoid that the polishing amount becomes insufficient as shown in FIG. 8, as the second comparative example, it is conceivable to increase the polishing amount by extension and so on of the polishing time of the CMP method and the like. However, when polishing is performed excessively by it, as shown in FIG. 20 as the second comparative example, it is possible that the silicon nitride film N1 (refer to FIG. 6) is entirely removed, and polishing is performed as far as the silicon oxide film O1 (refer to FIG. 6) below the silicon nitride film N1, the upper surface of the semiconductor substrate SB, and the upper surface of the silicon oxide film O2 within the trench T2.

When the polishing amount is excessively large as shown in FIG. 20, the upper surface of the semiconductor substrate SB retreats, and the depth of the trench T2 which is the film thickness of the element isolation region STI comprised of the silicon oxide film O2 becomes small. In this case, even when a semiconductor elements are formed by executing the step to be performed thereafter which is the step similar to the steps explained using FIG. 11 to FIG. 15, because the element isolation region STI has not the depth required for electrical element separation, there is a risk that the withstand voltage between plural elements cannot be maintained.

Also, when the polishing amount is excessively large as shown in FIG. 20, it is possible that the upper surface of the silicon oxide film O2 retreats and the side wall of the trench T2 is exposed by the etching step or the ion-implantation step explained using FIG. 12 performed after the polishing step. In this case, there is a risk that, when a conductive film is formed over the semiconductor substrate SB between the plural active regions so as to stride the element isolation region STI, the conductive film contacts the side wall of the trench T2, and thereby the semiconductor substrate SB of each of the plural active regions embracing the element isolation region STI short-circuits through the conductive film.

Apart from the first and second comparative examples described above, below, as the third comparative example, a manufacturing step of a semiconductor device will be explained in which the steps explained using FIG. 1 to FIG. 7 are performed and polishing is performed appropriately as shown in FIG. 7. In this case also, the wet etching step explained using FIG. 9 and FIG. 10 is not performed.

Therefore, the height of the upper surface of the silicon oxide film O2 within the trench T1 is higher than the height of the upper surface of the silicon oxide film O2 within the trench T1 shown in FIG. 9.

In the manufacturing step of a semiconductor device of the third comparative example in which polishing has been performed appropriately as described above, after the structure shown in FIG. 7 has been obtained, a step similar to the step explained using FIG. 11 is performed as shown in FIG. 21. In other words, as shown in FIG. 21, by removing the silicon nitride film N1, the element isolation region STI comprised of the silicon oxide film O2 is formed. Thereby, a level difference is formed between the upper surface of the silicon oxide film O2 that is exposed over the semiconductor substrate SB and the upper surface of the silicon oxide film O1. More specifically, the upper surface of the silicon oxide film O2 projects upward compared to the upper surface of the silicon oxide film O1 beside the silicon oxide film O2 and the upper surface of the semiconductor substrate SB.

Here, the side wall of the silicon oxide film O2 higher than the upper surface of the silicon oxide film O1 has a reverse tapered shape. In other words, the side wall of the silicon oxide film O2 over the silicon oxide film O1 has a shape of eaves, and there is a space between the side wall and the silicon oxide film O1 right below the side wall. Therefore, in the side wall of the silicon oxide film O2 which is the end of the element isolation region STI, a recess is formed above the silicon oxide film O1. The reason the side wall of the silicon oxide film O2 higher than the upper surface of the silicon oxide film O1 has a reverse tapered shape thus is that the side wall of the silicon nitride film N1 (refer to FIG. 6) is tapered.

Figure 22:
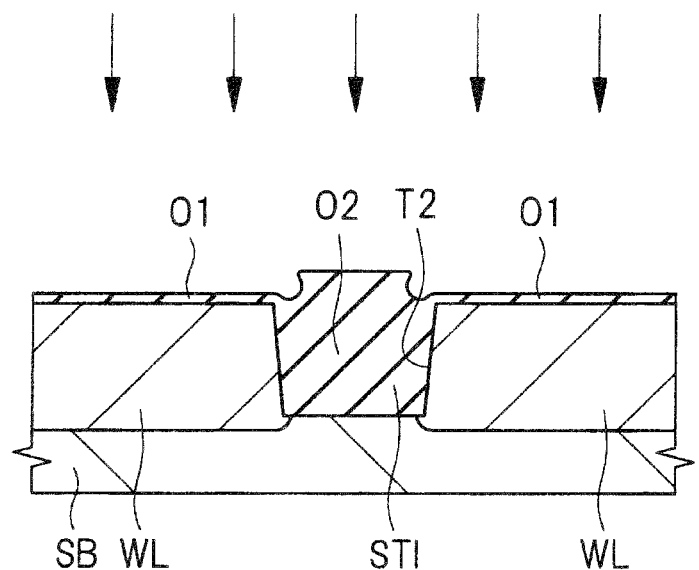
FIG. 22 is a cross-sectional view showing the method for manufacturing a semiconductor device subsequent to FIG. 21.

Next, as shown in FIG. 22, by performing a step similar to the step explained using FIG. 12, P-wells WL are formed in the upper surface of the semiconductor substrate SB. By ion-implantation or etching and the like performed here, the upper surface of the element isolation region STI is wet-etched. Accordingly, the exposed surface of the element isolation region STI retreats, and therefore the recess of the end of the element isolation region STI becomes large. Thus, a level difference is generated in the upper surface of the element isolation region STI, and therefore the height difference of approximately 15 nm is generated between the end of the upper surface and the center of the upper surface. The height of the center part of the upper surface of the element isolation region STI is positioned in a region higher than the upper surface of the semiconductor substrate SB.

Figure 23:
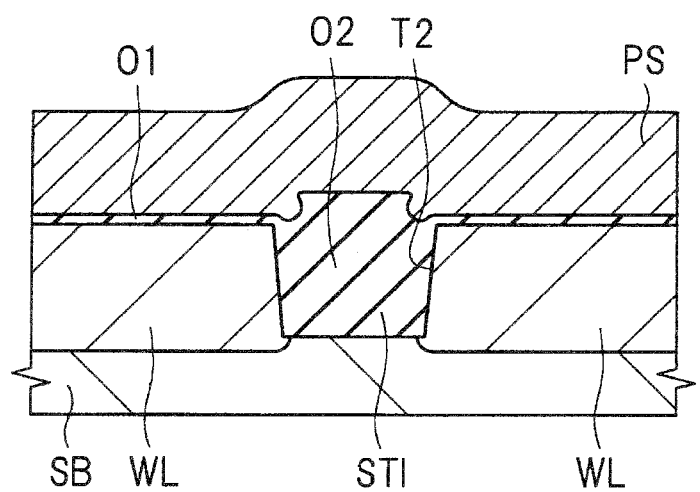
FIG. 23 is a cross-sectional view showing the method for manufacturing a semiconductor device subsequent to FIG. 22.

Next, as shown in FIG. 23, by performing a step similar to the step explained using FIG. 13, the poly-silicon film PS is formed over the semiconductor substrate SB and over the element isolation region STI. Here, a level difference is formed in the upper surface of the element isolation region STI, the height of a part of the upper surface of the element isolation region STI is higher than the height of the upper surface of the silicon oxide film O1, and therefore the upper surface of the poly-silicon film PS right above the element isolation region STI is positioned in a region higher than the upper surface of the poly-silicon film PS right above the silicon oxide film O1. In other words, in the upper surface of the poly-silicon film PS, a height difference is generated between the inactive region and the active region.

Figure 24:
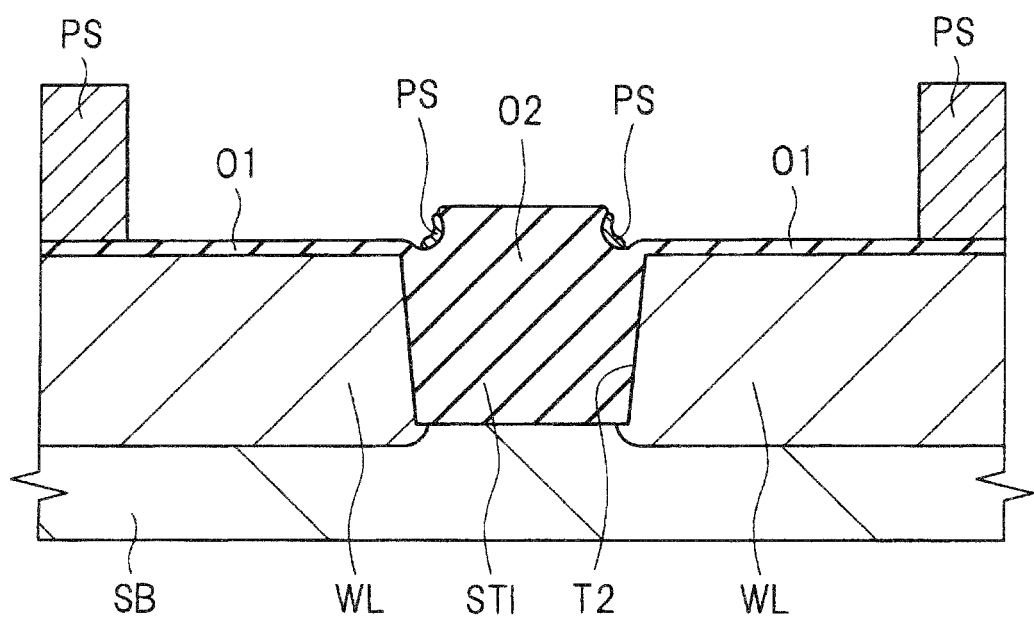
FIG. 24 is a cross-sectional view showing the method for manufacturing a semiconductor device subsequent to FIG. 23.

Next, as shown in FIG. 24, by performing a step similar to the step explained using FIG. 14, the poly-silicon film PS is subjected to patterning. Here, a pattern of the photoresist film is formed by exposing/developing the photoresist film (not illustrated) formed on the poly-silicon film PS using the photolithography technology, dry etching is performed using the pattern as the mask, and thereby the poly-silicon film PS is worked. Thereafter, the step explained using FIG. 15 is performed, the diffusion layer, the contact plugs and the like are formed, and thereby the semiconductor device of the comparative example is completed. Also, in FIG. 24, the semiconductor substrate SB and the like are shown enlarged compared to FIG. 23.

Here, because there is a height difference in the upper surface of the poly-silicon film PS between the inactive region and the active region as shown in FIG. 23, a height difference is generated also in the upper surface of the photoresist film (not illustrated) formed over the poly-silicon film PS. Therefore, in the patterning step explained using FIG. 24, it is hard to perform exposure with the entire upper surface of the photoresist film being focused. Accordingly, such problem occurs that the reliability of the photoresist film deteriorates by occurrence of defocusing, or the working accuracy of the poly-silicon film PS deteriorates. Therefore, there is a risk that the yield in the manufacturing step of the semiconductor device drops.

Also, it is possible that a part of the poly-silicon film PS is not removed and remains in the recess of the level difference portion of the element isolation region STI as shown in FIG. 24. The reason is that, when the poly-silicon film PS is worked by dry etching that is anisotropic etching, the poly-silicon film PS in the recess formed in the vicinity of the end of the upper surface of the element isolation region STI cannot be removed. Such residue of the poly-silicon film PS is liable to be generated when the height difference of the level difference of the upper surface of the element isolation region STI becomes 15 nm or more.

The poly-silicon films PS having remained in the recesses of the upper surface of the element isolation region STI without being removed as described above extend along the element isolation regions STI that extend in a predetermined direction in a plan view. When the washing step or the etching step and the like is performed after the patterning step of the poly-silicon film PS described above, if the poly-silicon film PS having remained in the recess peels off from the surface of the element isolation regions STI, it becomes a cause of the short-circuit between the elements and the like. Also, because the poly-silicon film PS having peeled off from the surface of the element isolation regions STI remains as the etching residue over the semiconductor substrate SB, it becomes a cause of the film formation failure in the later film forming step performed over the semiconductor substrate SB. Because short-circuit or film formation failure occurs by the residue of the poly-silicon film PS thus, such problems occur that the reliability of the semiconductor device deteriorates and the yield of the manufacturing step of the semiconductor device drops.

Here, in order to prevent the event that the silicon nitride film N1 (refer to FIG. 6) is entirely removed by excessive polishing and the upper surface of the semiconductor substrate SB is polished as in the second comparative example explained using FIG. 20, it is conceivable to increase the film thickness of the silicon nitride film N1 formed in the step explained using FIG. 1. More specifically, when the film thickness of the silicon nitride film N1 is made 200 nm or more, even when there is a dispersion in the polishing amount, polishing can be easily stopped in the middle of the film thickness of the silicon nitride film N1 as shown in FIG. 7.

However, when the film thickness of the silicon nitride film N1 is large, even if polishing is performed to the middle of the film thickness of the silicon nitride film N1 and polishing can be performed appropriately as shown in FIG. 7, the height of the silicon oxide film O2 formed within the trench T1 becomes high. Therefore, because the level difference of the side wall of the silicon oxide film O2 over the silicon oxide film O1 after having removed the silicon nitride film N1 becomes large as shown in FIG. 21, the poly-silicon film PS is liable to remain in the recess of the surface of the element isolation region STI shown in FIG. 24. In this case, occurrence of short-circuit or film formation failure caused by generation of the residue of the poly-silicon film PS becomes more significant.

Therefore, from the viewpoint of reducing the level difference in the upper surface of the element isolation region STI, it is not preferable to increase the film thickness of the silicon nitride film N1 (refer to FIG. 6). Particularly, when the film thickness of the silicon nitride film N1 is 200 nm or more, generation of the residue of the poly-silicon film PS becomes further more significant.

Although 3 types of comparative examples were explained above, with respect to them, in the present embodiment, as explained using FIG. 9 or FIG. 10, the wet etching step for removing a part of the silicon oxide film O2 is added after the polishing step.

Thus, as explained using FIG. 8 in the first comparative example, even when the silicon nitride film N1 is covered by the silicon oxide film O2 due to insufficient polishing amount, the upper surface of the silicon nitride film N1 can be exposed by wet etching, and a part of the side wall of the trench T1 which is a part of the side wall of the silicon nitride film N1 can be exposed. Therefore, even when the polishing amount of the polishing step explained using FIG. 8 may be comparatively small, the silicon nitride film N1 can be removed in the step for removing the silicon nitride film N1 explained using FIG. 11. Accordingly, because the semiconductor element can be formed normally in the subsequent step, the yield in the manufacturing step of the semiconductor device can be improved, and the manufacturing cost of the semiconductor device can be reduced.

Also, as explained using FIG. 20 in the second comparative example, such event can be prevented that the upper surface of the semiconductor substrate SB retreats due to excessive polishing and the film thickness of the element isolation region STI becomes thin. The reason is that, as explained above using FIG. 8, even when the polishing amount is insufficient and the silicon oxide film O2 may remain over the silicon nitride film N1, the silicon oxide film O2 can be removed by wet etching explained using FIG. 10, and thereby the polishing time and so on can be adjusted so that the polishing amount in the polishing step explained using FIG. 7 or FIG. 8 is reduced. In other words, in the present embodiment, because the problem caused by suppression of the polishing amount can be eliminated, it is easy to control the polishing amount so as not to perform excessive polishing.

Further, in the present embodiment, it is also possible to prevent excessive polishing in the polishing step by further increasing the film thickness of the silicon nitride film N1 formed in the step explained using FIG. 1. The reason is that the height of the silicon oxide film O2 within the trench T1 can be reduced optionally by performing the wet etching step explained using FIG. 9 or FIG. 10. Thus, even when the film thickness of the silicon nitride film N1 is increased, such event can be prevented that a large level difference is formed in the upper surface of the element isolation region STI (refer to FIG. 11) and the residue of the poly-silicon film is generated.

Therefore, in the present embodiment, even when the film thickness of the silicon nitride film N1 (refer to FIG. 1) is made 200 nm or more, formation of the level difference in the upper surface of the element isolation region STI can be prevented. Therefore, even when the polishing amount in polishing the silicon oxide film O2 over the silicon nitride film N1 may be dispersed, it is easy to stop polishing in the middle of the film thickness of the silicon nitride film N1 as shown in FIG. 7, and the upper surface of the semiconductor substrate SB can be prevented from being polished.

Also, as explained using FIG. 21 to FIG. 24 in the third comparative example, because generation of the level difference in the upper surface of the element isolation region STI can be prevented and generation of the residue of the poly-silicon film can be prevented, the short-circuit between the semiconductor elements or the failure of film formation over the semiconductor substrate SB and so on can be prevented, thereby the reliability of the semiconductor device can be improved, and the yield in the manufacturing step of the semiconductor device can be improved. The reason is that the height of the silicon oxide film O2 within the trench T1 can be lowered as much as possible by the wet etching step after polishing as explained using FIG. 9 or FIG. 10, and therefore the level difference between the upper surfaces of each of the silicon oxide film O2 and the silicon oxide film O1 can be reduced in performing the step for removing the silicon nitride film N1 (refer to FIG. 11).

Thus, the height difference between the upper surface of the element isolation region STI and the upper surface of the semiconductor substrate SB shown in FIG. 11 reduces, the upper surface of the substrate including the semiconductor substrate SB and the element isolation region STI becomes almost flat, and therefore, even when ion-implantation and the like is performed as shown in FIG. 12, the recess is not formed in the surface of the element isolation region STI. Accordingly, even when working is performed after formation of the poly-silicon film PS as shown in FIG. 13 and FIG. 14, formation of the residue of the poly-silicon film PS in the surface of the element isolation region STI can be prevented.

Below, a modification of the method for manufacturing a semiconductor device of the present embodiment will be explained using FIG. 16 to FIG. 19. FIG. 16 to FIG. 19 are cross-sectional views explaining the modification of the method for manufacturing a semiconductor device of the present embodiment. The manufacturing method of the present modification is different from the manufacturing method explained using FIG. 1 to FIG. 15 in terms that a bird's beak comprised of a silicon oxide film is formed over the semiconductor substrate adjacent to the element isolation region.

In the present modification, first, a part of the upper surface of the semiconductor substrate SB is exposed from the silicon nitride film N1 that is the hard mask by performing the steps explained using FIG. 1 and FIG. 2.

Figure 16:
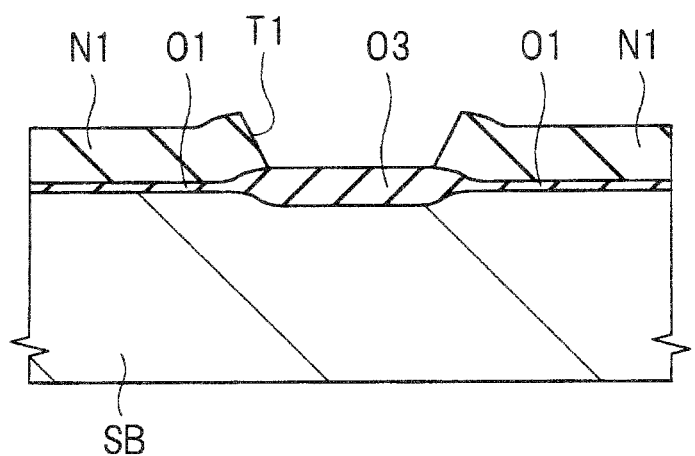
FIG. 16 is a cross-sectional view showing a method for manufacturing a semiconductor device which is an alternative example of an embodiment of the present invention.

Next, as shown in FIG. 16, an oxidation treatment is performed using a thermal oxidation method and the like, and a silicon oxide film O3 having larger film thickness than the silicon oxide film O1 is formed over the semiconductor substrate SB in the bottom of the trench T1. At this time, the oxidation treatment may be performed after the silicon oxide film O1 in the bottom of the trench T1 is removed and the upper surface of the semiconductor substrate SB is exposed from the silicon oxide film O1. Also, here, each of the boundaries between the silicon oxide films O1, O3, and the silicon oxide film O2 (refer to FIG. 18) formed in the later step is not shown in the drawing, and a structure in which these films are integrated is illustrated.

The silicon oxide film O3 is formed by reaction of a part of the upper surface of the semiconductor substrate SB and O (oxygen). Because the silicon oxide film O3 is formed with a larger film thickness than the silicon oxide film O1, the bottom surface of the silicon oxide film O3 is positioned in a region lower than the bottom surface of the silicon oxide film O1, and the upper surface of the silicon oxide film O3 is positioned in a region higher than the upper surface of the silicon oxide film O1.

Further, the end of the silicon oxide film O3 is formed so as to also get between the silicon nitride film N1 and the semiconductor substrate SB formed in the active region. The end of the silicon oxide film O3 formed right below the silicon nitride film N1 has a shape of so-called bird's beak in which the film thickness reduces as it departs from the trench T1. The silicon nitride film N1 right above the end of the silicon oxide film O3 warps upward by formation of the silicon oxide film O3.

Figure 17:
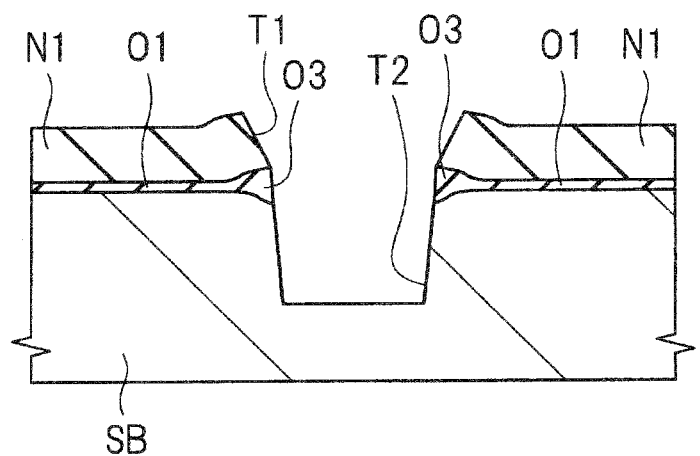
FIG. 17 is a cross-sectional view showing the method for manufacturing a semiconductor device subsequent to FIG. 16.

Next, as shown in FIG. 17, by performing the etching step similar to the step explained using FIG. 3, a trench T2 is formed which opens the silicon oxide film O3 and the semiconductor substrate SB. The trench T2 penetrates the silicon oxide film O3 and reaches the middle depth of the semiconductor substrate SB. Here, although the silicon oxide film O3 below the trench T1 is removed, the silicon oxide film O3 of the bird's beak shape between the silicon nitride film N1 and the semiconductor substrate SB is not removed and remains. In other words, the silicon oxide film O3 remains on the side wall of the trench T2.

Figure 18:
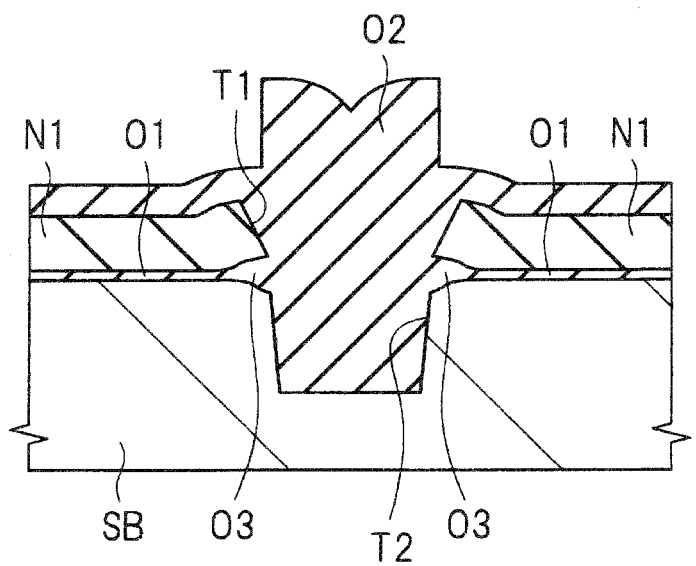
FIG. 18 is a cross-sectional view showing the method for manufacturing a semiconductor device subsequent to FIG. 17.

Next, as shown in FIG. 18, by performing the steps similar to the steps explained using FIG. 4 to FIG. 6, the silicon oxide film O2 is embedded within the trench T1 and within the trench T2. Here, because the silicon oxide film O3 is formed, the end of the silicon nitride film N1 warps up, and therefore the side wall of the silicon nitride film N1 is directed upward compared to a state before formation of the silicon oxide film O3. Therefore, the side wall of the silicon nitride film N1 which is the silicon oxide film O2 contacting the side wall within the trench T1 has a shape with a large inverse taper.

Figure 19:
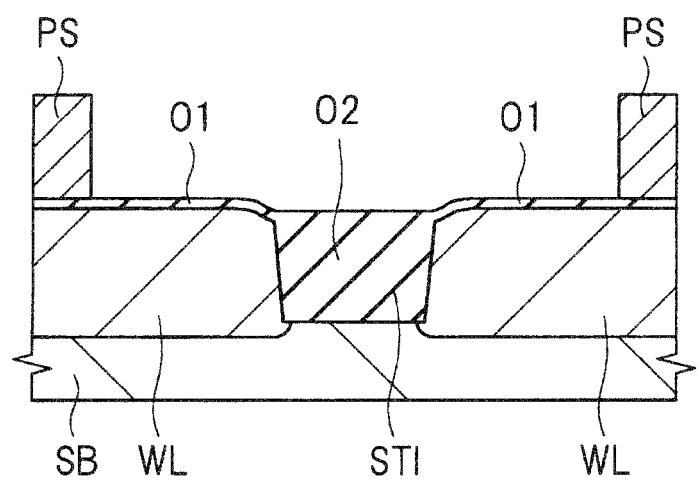
FIG. 19 is a cross-sectional view showing the method for manufacturing a semiconductor device subsequent to FIG. 18.

Next, as shown in FIG. 19, by performing the steps similar to the steps explained using FIG. 7 to FIG. 14, the element isolation region STI comprised of the silicon oxide film O2 and a gate electrode comprised of the poly-silicon film PS are formed. Thereafter, by performing the step similar to the step explained using FIG. 15, the semiconductor device of the present modification is completed. More specifically, after a part of the silicon oxide film O2 and a part of the silicon nitride film N1 over the semiconductor substrate SB are removed by polishing, the wet etching step (refer to FIG. 9 or FIG. 10) is performed, then the silicon nitride film N1 is removed, and thereby the element isolation region STI is formed. Thereafter, the semiconductor element is formed through various ion-implantation step, etching step, film forming step and the like, and the contact layer including the contact plugs and the interlayer insulation film is formed.

In the present modification, as shown in FIG. 17, by forming the bird's beak comprised of the silicon oxide film O3 between the end of the silicon nitride film N1 in the region adjacent to the trench T2 and the semiconductor substrate SB right below the end of the silicon nitride film N1, the inclination of the shoulder part of the boundary between the semiconductor substrate SB and the element isolation region STI can be made dull as shown in FIG. 19. Thus, the electric field can be prevented from concentrating at the boundary of the semiconductor device completed, that is, the corner of the upper surface of the semiconductor substrate SB. Therefore, because the withstand voltage of the semiconductor device can be improved, the reliability of the semiconductor device can be improved.

In the present modification, when the step of removing the silicon nitride film N1 (refer to FIG. 21) is performed without performing the etching step in which the silicon oxide film O2 is retreated after performing the polishing step (refer to FIG. 7 or FIG. 8) as the third comparative example explained using FIG. 21 to FIG. 23, the inverse taper of the side wall of the silicon oxide film O2 and the side wall over the upper surface of the semiconductor substrate SB becomes larger than the case explained using FIG. 21. The reason is that, because the end of the silicon nitride film N1 right above the silicon oxide film O3 is warpingly held up by formation of the silicon oxide film O3 as explained using FIG. 18, the side wall of the silicon nitride film N1 is directed upward, and the inclination of the side wall of the silicon oxide film O2 having been formed so as to contact the side wall of the silicon nitride film N1 is increased.

Therefore, in the comparative example, when the silicon oxide film O3 of the bird's beak shape is formed, because the recess formed on the surface of the silicon nitride film N1 after the silicon nitride film N1 removing step (refer to FIG. 21) becomes large, the poly-silicon film PS (refer to FIG. 24) is liable to remain inside the recess, and thereby occurrence of the problem of the short-circuit or the film formation failure and the like caused by the residue of the poly-silicon film PS becomes notable.

To the contrary, according to the modification of the present embodiment, because the etching step explained using FIG. 9 or FIG. 10 is performed, the height of the silicon oxide film O2 having the height same to that of the silicon nitride film N1 which is the silicon oxide film O2 within the trench T1 can be lowered as much as possible. Therefore, even when the silicon nitride film N1 is held up by formation of the bird's beak, formation of the level difference in the upper surface of the element isolation region STI can be prevented, and therefore occurrence of the short-circuit or the film formation failure and the like by the residue of the poly-silicon film PS (refer to FIG. 24) can be prevented. Accordingly, the reliability of the semiconductor device can be improved, and the yield in the manufacturing step of the semiconductor device can be improved.

Although the invention achieved by the present inventors has been explained above specifically based on the embodiments, it is needless to mention that the present is not limited to the embodiments and various alterations are possible within a scope not deviating from the purposes thereof.

What is claimed is:

1. A method for manufacturing a semiconductor device, comprising the steps of:
    (a) providing a semiconductor substrate;
    (b) forming a first insulation film over the semiconductor substrate, the first insulation film including a tapered opening that exposes a part of the semiconductor substrate;
    (c) forming a tapered trench in the upper surface of the semiconductor substrate by performing etching using the first insulation film as a mask, the trench being tapered such that a width of the trench opening reduces as it approaches a bottom surface of the trench;
    (d) embedding a second insulation film in the inside of the trench by forming the second insulation film over the semiconductor substrate;
    (e) flattening the upper surface of the second insulation film by polishing the second insulation film over the first insulation film;
    (f) after the step (e), retreating the upper surface of the second insulation film by performing etching; and
    (g) after the step (f), removing the first insulation film.

2. The method for manufacturing a semiconductor device according to claim 1,
    wherein etching performed in the step (f) is wet etching.

3. The method for manufacturing a semiconductor device according to claim 1,
    wherein, when the first insulation film is removed in the step (g), the height of the upper surface of the second insulation film is higher than the height of the upper surface of the semiconductor substrate.

4. The method for manufacturing a semiconductor device according to claim 1, further comprising the step of:
    (h) after the step (g), retreating the surface of the second insulation film by performing wet etching.

5. The method for manufacturing a semiconductor device according to claim 1, further comprising the step of:
    (i) after the step (d) and before the step (e), covering the second insulation film right above the trench by a resist film, using the resist film as a mask, and retreating the upper surface of the second insulation film over the first insulation film.

6. The method for manufacturing a semiconductor device according to claim 1,
    wherein the film thickness of the first insulation film formed in the step (b) is 200 nm or more.

7. The method for manufacturing a semiconductor device according to claim 1,
    wherein the first insulation film is a silicon nitride film, and the second insulation film is a silicon oxide film.

8. The method for manufacturing a semiconductor device according to claim 1, further comprising the step of:
    (j) after the step (b) and before the step (c), forming a third insulation film between the end of the first insulation film and the semiconductor substrate by performing oxidation treatment.

9. The method for manufacturing a semiconductor device according to claim 1,
    wherein the upper surface of the first insulation film is not polished and the upper surface of the first insulation film is covered by the second insulation film even after polishing in the step (e), and
    wherein the second insulation film covering the upper surface of the first insulation film is removed in the step (f), and thereby the upper surface of the first insulation film is exposed.

* * * * *